(12) United States Patent
Chen et al.

(10) Patent No.: US 11,119,139 B2
(45) Date of Patent: Sep. 14, 2021

(54) INTEGRATED CIRCUIT WITH ANTENNA IN PACKAGE TESTING APPARATUS

(71) Applicant: CHUNGHWA PRECISION TEST TECH. CO., LTD., Taoyuan (TW)

(72) Inventors: Shin-tsung Chen, Taoyuan (TW); Wei-cheng Wang, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 140 days.

(21) Appl. No.: 16/575,420

(22) Filed: Sep. 19, 2019

(65) Prior Publication Data

US 2021/0011069 A1    Jan. 14, 2021

(30) Foreign Application Priority Data

Jul. 8, 2019 (TW) .................................. 108123971

(51) Int. Cl.
| | | |
|---|---|---|
| *G01R 31/00* | (2006.01) | |
| *G01R 29/10* | (2006.01) | |
| *H01Q 1/22* | (2006.01) | |
| *G01R 1/04* | (2006.01) | |
| *G01R 31/28* | (2006.01) | |

(52) U.S. Cl.
CPC .............. *G01R 29/10* (2013.01); *G01R 1/045* (2013.01); *G01R 31/2891* (2013.01); *G01R 31/2896* (2013.01); *H01Q 1/2283* (2013.01)

(58) Field of Classification Search
CPC ............ G01R 31/2822; G01R 31/2863; G01R 31/2882; G01R 31/2886; G01R 31/2896; G01R 31/2891; G01R 31/3025; G01R 31/31716; G01R 31/31905
See application file for complete search history.

(56) References Cited

U.S. PATENT DOCUMENTS

| | | | |
|---|---|---|---|
| 2012/0268153 A1* | 10/2012 | Nickel ............... | G01R 31/3025 |
| | | | 324/754.31 |
| 2017/0279491 A1* | 9/2017 | Lam ........................ | H04B 3/46 |
| 2018/0003754 A1* | 1/2018 | Schrattenecker .... | H01Q 1/2283 |
| 2019/0113556 A1* | 4/2019 | Kao ........................ | G01R 1/045 |
| 2019/0162767 A1* | 5/2019 | Wang .................... | G01R 31/002 |
| 2019/0162774 A1* | 5/2019 | Huang ................... | G01R 1/045 |
| 2019/0310314 A1* | 10/2019 | Liu ...................... | G01R 31/3025 |
| 2021/0033668 A1* | 2/2021 | Trotta .................. | H01Q 1/2283 |
| 2021/0072307 A1* | 3/2021 | Fang ................... | G01R 31/2887 |

* cited by examiner

*Primary Examiner* — Thang X Le
(74) *Attorney, Agent, or Firm* — Mark M. Friedman

(57) ABSTRACT

An integrated circuit with antenna in package (AiP IC) testing apparatus is provided, and includes: a carrier board, a test socket, and a receiving antenna circuit board. The test socket is disposed on the carrier board and configured to carry an AiP IC which emits a wireless signal. The receiving antenna circuit board is adjacent to the test socket and configured to receive the wireless signal. The receiving antenna circuit board and the reflector are integrated into the AiP IC testing apparatus, so that the AiP IC testing apparatus can be used not only for testing a feedback signal transmitted by a test pin of the IC, but also for testing the wireless signal from the IC.

7 Claims, 4 Drawing Sheets

INTEGRATED CIRCUIT WITH ANTENNA IN PACKAGE TESTING APPARATUS

FIELD OF DISCLOSURE

The present disclosure relates to an integrated circuit with antenna in package (AiP IC) testing apparatus, and more particularly to a testing apparatus for testing a wireless signal from the AiP IC.

BACKGROUND

As electronic products move toward precision and multi-functionality, a structure of integrated circuits (ICs) used in electronic products tends to be complicated. For example, ICs have become more complex with a use of an antenna in package (AiP) technology. In order to verify a performance of an AiP IC, an over-the-air (OTA) method is employed to test the AiP IC components, and existing measurement methods through wiring are no longer sufficient. That is, for different IC products, two different systems must be provided to test the IC's pin signal and the IC's wireless signal. Thus, a cost of production operations is increased and a burden on maintaining an enterprise has been raised. Accordingly, it is necessary to provide an AiP IC testing apparatus to solve the technical problem in the prior art.

SUMMARY OF DISCLOSURE

In order to solve the above problems in the prior art, an object of the present disclosure is to provide a testing apparatus that can test both a wireless signal and a pin signal from an IC.

In order to achieve the objects described above, the present disclosure provides an integrated circuit with antenna in package (AiP IC) testing apparatus, including: a carrier board, a test socket, and a receiving antenna circuit board. The test socket is disposed on the carrier board and configured to carry an AiP IC which emits a wireless signal. The receiving antenna circuit board is adjacent to the test socket and configured to receive the wireless signal.

In one preferable embodiment of the present disclosure, the AiP IC testing apparatus also includes a reflector disposed above the test socket and configured to reflect the wireless signal emitted by the AiP IC and direct the wireless signal to the receiving antenna circuit board.

In one preferable embodiment of the present disclosure, the AiP IC testing apparatus also includes a frame and a cover. The frame is disposed on the carrier board and surrounding the test socket. The cover is detachably disposed on the frame. The reflector is mounted on a surface of the cover facing the test socket.

In one preferable embodiment of the present disclosure, the test socket includes a plurality of pogo pins, and the cover includes a protrusion member, and each of the pogo pins includes a compressed state and an initial state. In response to the frame being separated from the cover, the plurality of pogo pins are in the initial state and are electrically separated from the carrier board. In response to the cover being assembled with the frame, the protrusion member of the cover contacts a periphery of the AiP IC, and the protrusion member applies a pressure to the periphery of the AiP IC, such that the plurality of pogo pins are converted from the initial state to the compressed state and electrically contacted with the carrier board.

In one preferable embodiment of the present disclosure, the AiP IC testing apparatus also includes a soft board disposed on the test socket. The receiving antenna circuit board is disposed at an angle on the soft board.

In one preferable embodiment of the present disclosure, the AiP IC testing apparatus also includes an angle adjuster disposed between the receiving antenna circuit board and the soft board, such that the receiving antenna circuit board is rotatably connected to the soft board, and the angle between the receiving antenna circuit board and the soft board is adjusted by the angle adjuster.

In one preferable embodiment of the present disclosure, the receiving antenna circuit board is formed on the carrier board and integrated in an interposer of the carrier boards.

In one preferable embodiment of the present disclosure, a receiving surface of the receiving antenna circuit board is parallel to an emitting surface of the AiP IC that emits the wireless signal.

In one preferable embodiment of the present disclosure, the AiP IC testing apparatus also includes a connector and a coaxial-cable which are connected between the receiving antenna circuit board and an external instrument. In response to the receiving antenna circuit board receiving the wireless signal, the receiving antenna circuit board transmits the wireless signal to the external instrument via the connector and the coaxial-cable.

In comparison to the prior art, the present disclosure integrates the receiving antenna circuit board and the reflector into the AiP IC testing apparatus, so that the AiP IC testing apparatus can be used not only for testing a feedback signal transmitted by a test pin of the IC, but also for testing the wireless signal from the IC.

DETAILED DESCRIPTION

The structure and the technical means adopted by the present disclosure to achieve the above and other objects can be best understood by referring to the following detailed description of the preferred embodiments and the accompanying drawings.

Figure 1:
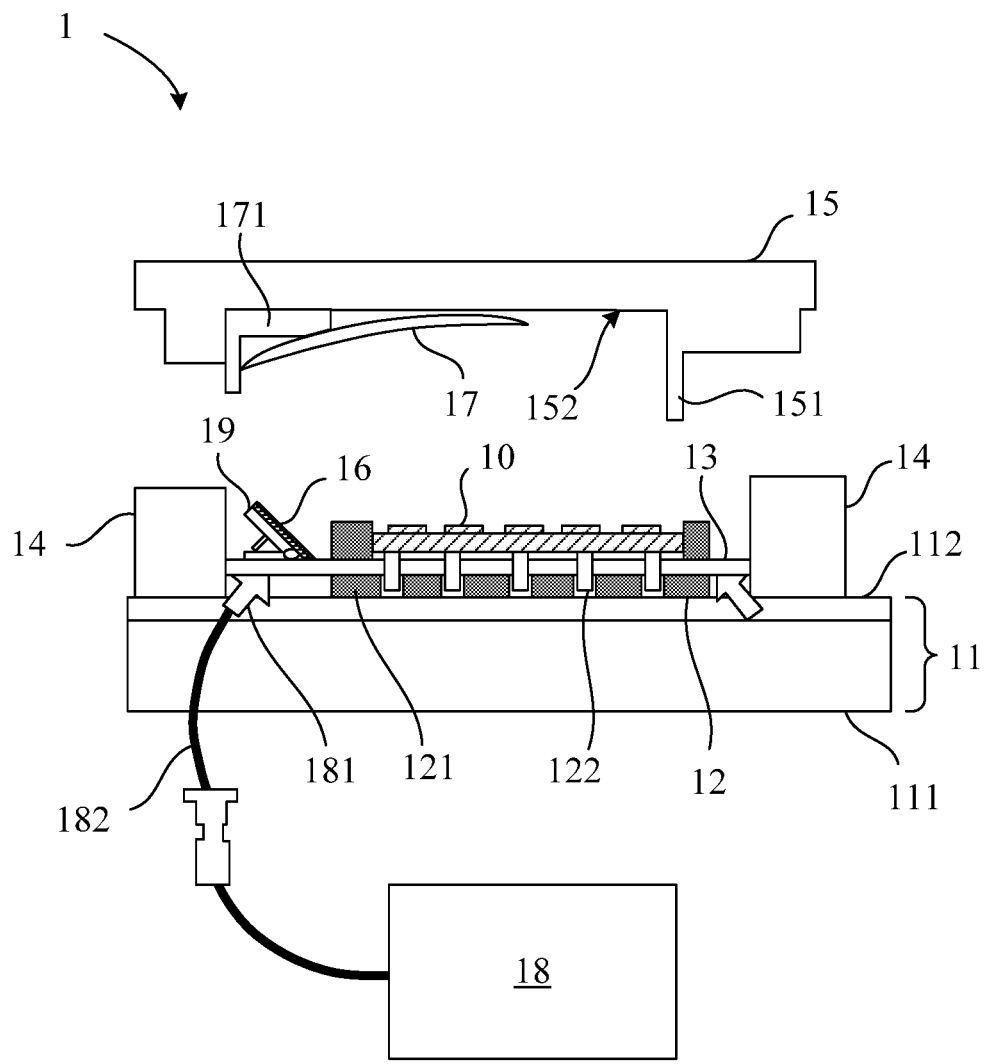
FIG. 1 is a schematic diagram showing before applying a pressure to an AiP IC testing apparatus according to a first preferred embodiment of the present disclosure.
Figure 2:
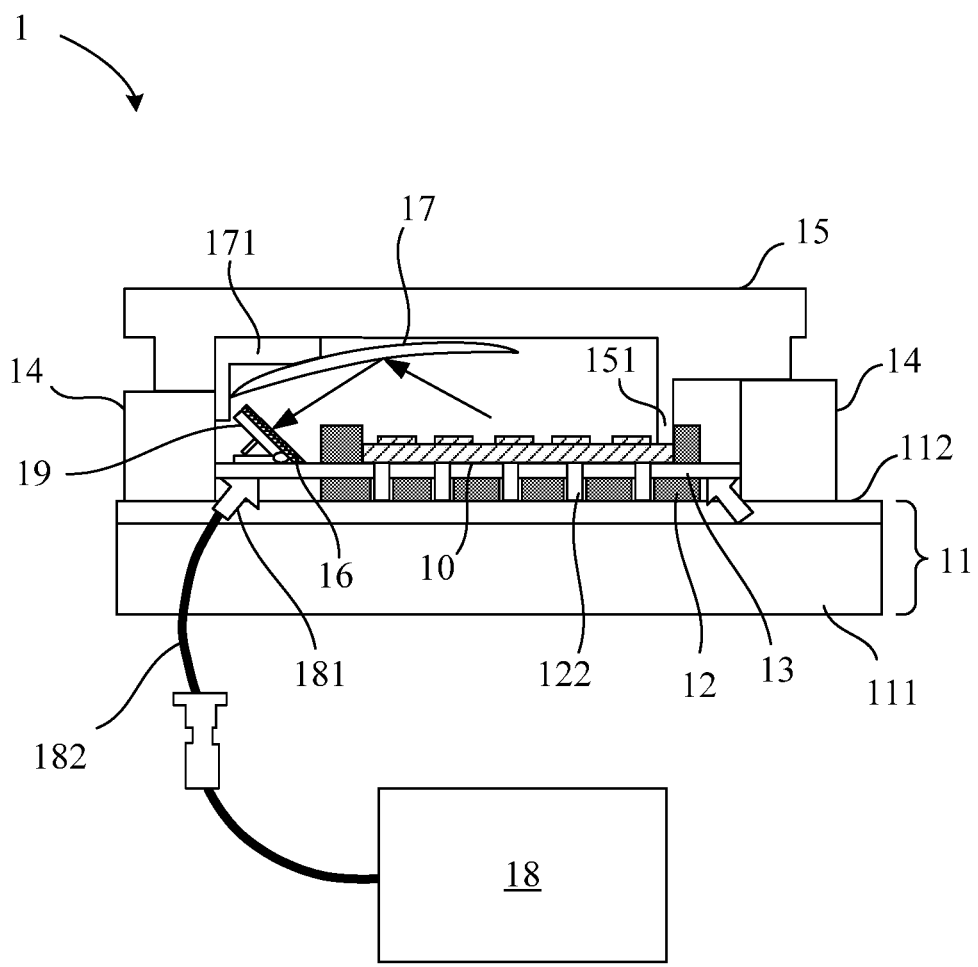
FIG. 2 is a schematic diagram showing after applying the pressure to the AiP IC testing apparatus of FIG. 1.

Please refer to FIG. 1 and FIG. 2, where FIG. 1 is a schematic diagram showing before applying a pressure to an AiP IC testing apparatus 1 according to a first preferred embodiment of the present disclosure, and FIG. 2 is a schematic diagram showing after applying the pressure to the AiP IC testing apparatus 1 of FIG. 1. In the present disclosure, the AiP IC testing apparatus 1 is preferably disposed in an over-the-air (OTA) chamber system for testing a signal emitted by an AiP IC 10. The signal is compliance with any wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

As shown in FIG. 1 and FIG. 2, the AiP IC testing apparatus 1 includes a carrier board 11, a test socket 12, a soft board 13, a frame 14, a cover 15, a receiving antenna circuit board 16, and a reflector 17. The carrier board 11 includes a circuit board 111 and an interposer 112 formed on the circuit board 111. The test socket 12 is disposed on the carrier board 11 for carrying the AiP IC 10. The AiP IC 10 can emit a wireless signal, such as a millimeter wave (mmWAVE) RF signal. Specifically, the test socket 12 includes an insulating guide base 121 and a plurality of pogo pins 122. The insulating guide base 121 is fixed on the carrier board 11, and the pogo pins 122 are aligned with corresponding elements (for example, contact pads) of the interposer 112 of the carrier board 11. The AiP IC 10 is placed on the test socket 12 and is in contact with one end of each pogo pin 122. The soft board 13 is disposed on the test socket 12 and is located between the AiP IC 10 and the test socket 12. The frame 14 is disposed on the carrier board 11 and surrounds the test socket 12 and the soft board 13. The cover 15 is detachably disposed on the frame 14. The cover 15 includes a first surface 152 and a protrusion member 151. The first surface 152 faces the test socket 12, and the protrusion member 151 protrudes outward relative to the first surface 152. The reflector 17 is disposed above the test socket 12. Specifically, the reflector 17 is mounted on the first surface 152 of the cover 15. Optionally, the reflector 17 is assembled to the cover 15 by a connecting part 171. The connecting part 171 can be a glue or a bracket or the like. Alternatively, the reflector 17 may be formed directly on the first surface 152 of the cover 15 by insert molding, and is not limited thereto.

As shown in FIG. 1 and FIG. 2, the receiving antenna circuit board 16 is disposed at an angle on the soft board 13, and the receiving antenna circuit board 16 is adjacent to the test socket 12. It should be noted that the receiving antenna circuit board 16 and the soft board 13 are always electrically connected, that is, signals can be mutually transmitted between the two. Optionally, an adjustment of the angle between the receiving antenna circuit board 16 and the soft board 13 is implemented by providing an angle adjuster 19 in this embodiment. For example, the angle adjuster 19 is disposed between the receiving antenna circuit board 16 and the soft board 13, such that the receiving antenna circuit board 16 is rotatably connected to the soft board 13, and the angle between the receiving antenna circuit board 16 and the soft board 13 is adjusted by the angle adjuster 19.

As shown in FIG. 1 and FIG. 2, each pogo pin 122 of test socket 12 includes a compressed state and an initial state. Specifically, as shown in FIG. 1, if the frame 14 is separated from the cover 15, the pogo pins 122 are in the initial state, and the pogo pins 122 are electrically separated from the carrier board 11. As shown in FIG. 2, if the frame 14 is assembled with the cover 15, the protrusion member 151 of the cover 15 is in contact with a periphery of the AiP IC 10, and the protrusion member 151 applies a downward pressure to the periphery of the AiP IC 10, so that the pogo pins 122 are converted from the initial state to the compressed state, and then one end of each pogo pin 122 is in electrical contact with a corresponding component (e.g., a contact pad) of the interposer 112 of the carrier board 11.

In the present disclosure, after the wireless signal emitted by the AiP IC 10 is transmitted upward to reach the reflector 17, the reflector 17 reflects the wireless signal and directs it to the receiving antenna circuit board 16. Then, the receiving antenna circuit board 16 can transmit the wireless signal from the AiP IC 10 to an external instrument for corresponding signal processing and analyzing. For example, the soft board 13 is connected to the external instrument 18 via a connector 181 and a coaxial-cable 182. Thus, the wireless signal (such as a high-speed RF signal) received by the receiving antenna circuit board 16 can be sequentially transmitted through the soft board 13, the connector 181, and the coaxial-cable 182 to the external instrument 18. In the present disclosure, the external instrument 18 may include, but is not limited to, an automatic test equipment (ATE).

Alternatively, when the carrier board 11 is in electrical contact with the test socket 12, the test socket 12 can receive a test signal from the carrier board 11 and pass it to the AiP IC 10 to drive the AiP IC 10 to generate a feedback signal. Moreover, the feedback signal can be transmitted back to the carrier board 11 via the test socket 12, and then the feedback signal can be output to an analytical instrument via the carrier board 11.

In summary, in the first embodiment of the present disclosure, by setting the soft board 13 integrated with the receiving antenna circuit board 16 and the reflector 17 in the AiP IC testing apparatus 1, the AiP IC testing apparatus 1 can be used not only to test the feedback signal transmitted by the test pin of the AiP IC 10, but also to test the wireless signal from the AiP IC 10. Furthermore, by adjusting the angle of the receiving antenna circuit board 16, a receiving angle of the receiving antenna circuit board 16 can be appropriately adjusted to reduce a transmission distance after the wireless signal is reflected, thereby reducing signal loss.

Figure 3:
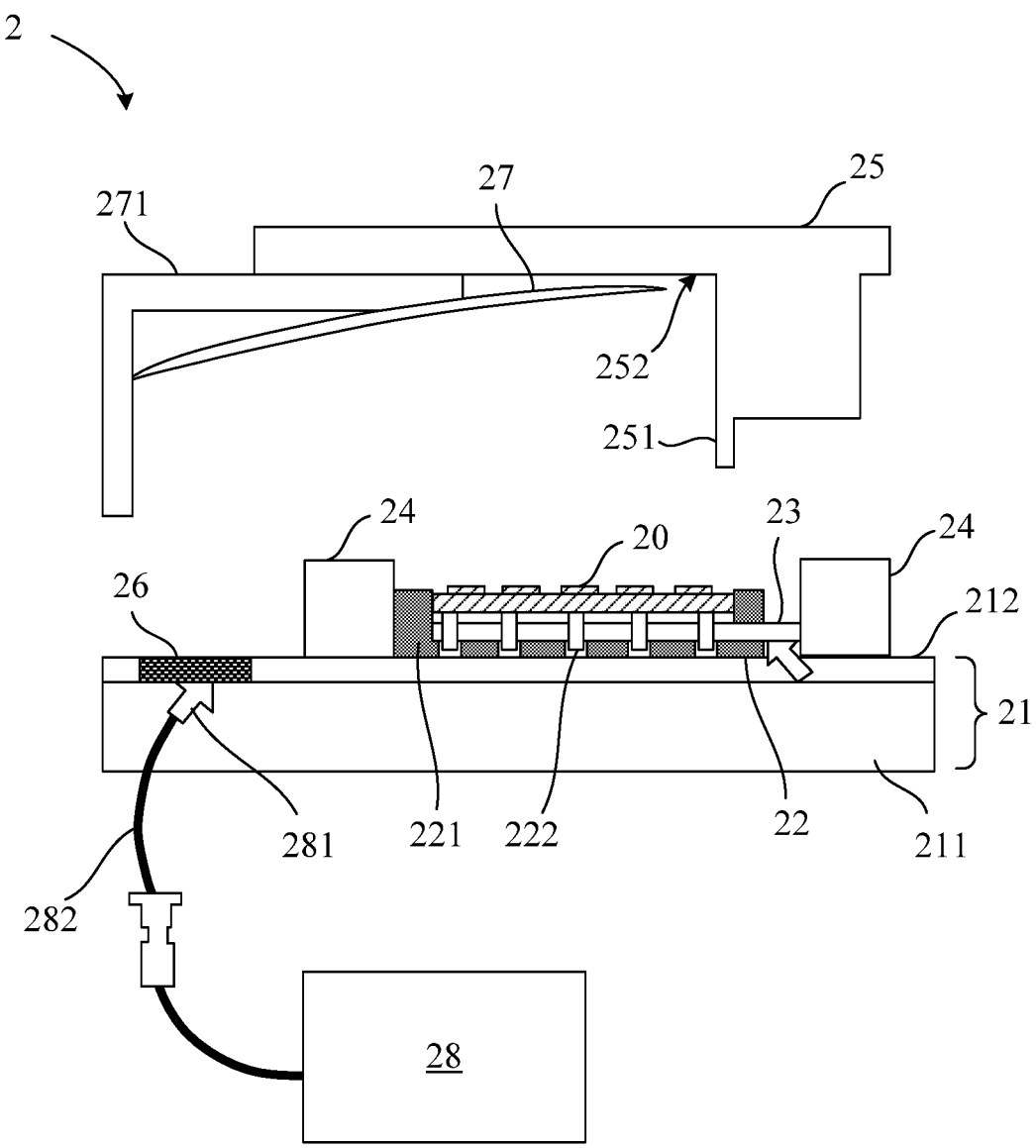
FIG. 3 is a schematic diagram showing before applying a pressure to an AiP IC testing apparatus according to a second preferred embodiment of the present disclosure.
Figure 4:
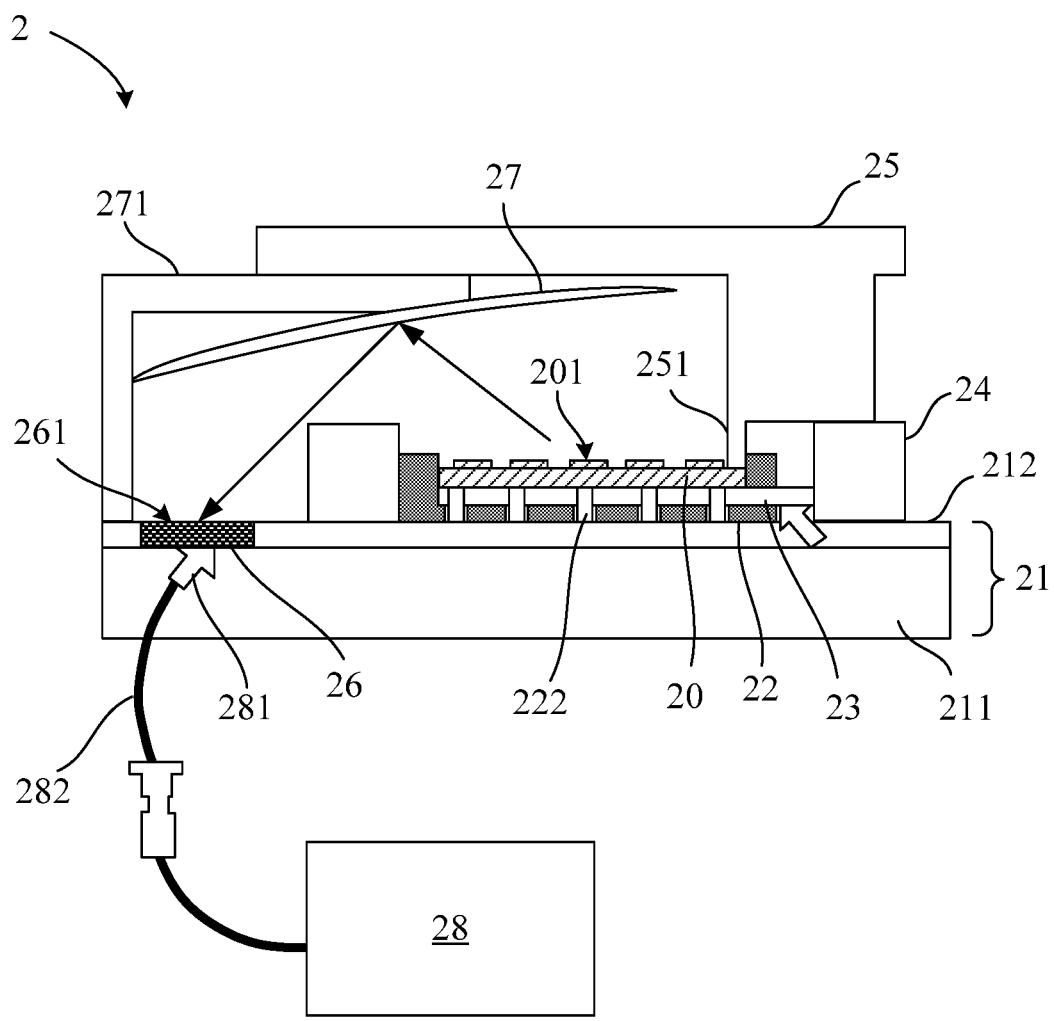
FIG. 4 is a schematic diagram showing after applying the pressure to the AiP IC testing apparatus of FIG. 3.

Please refer to FIG. 3 and FIG. 4, where FIG. 3 is a schematic diagram showing before applying a pressure to an AiP IC testing apparatus 2 according to a second preferred embodiment of the present disclosure, and FIG. 4 is a schematic diagram showing after applying the pressure to the AiP IC testing apparatus 2 of FIG. 3. In the present disclosure, the AiP IC testing apparatus 2 is preferably disposed in an over-the-air (OTA) chamber system for testing a signal emitted by an AiP IC 20. The signal is compliance with any wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

As shown in FIG. 3 and FIG. 4, the AiP IC testing apparatus 2 includes a carrier board 21, a test socket 22, a soft board 23, a frame 24, a cover 25, a receiving antenna circuit board 26, and a reflector 27. The carrier board 21 includes a circuit board 211 and an interposer 212 formed on the circuit board 211. The test socket 22 is disposed on the carrier board 21 for carrying the AiP IC 20. The AiP IC 20 can emit a wireless signal, such as a millimeter wave (mmWAVE) RF signal. Specifically, the test socket 22 includes an insulating guide base 221 and a plurality of pogo pins 222. The insulating guide base 221 is fixed on the carrier board 21, and the pogo pins 222 are aligned with corresponding elements (for example, contact pads) of the interposer 212 of the carrier board 21. The AiP IC 20 is placed on the test socket 22 and is in contact with one end of each pogo pin 222. The soft board 23 is disposed on the test socket 22 and is located between the AiP IC 20 and the test socket 22. The frame 24 is disposed on the carrier board 21 and surrounds the test socket 22 and the soft board 23. The cover 25 is detachably disposed on the frame 24. The cover 25 includes a first surface 252 and a protrusion member 251. The first surface 252 faces the test socket 22, and the protrusion member 251 protrudes outward relative to the first surface 252. The reflector 27 is disposed above the test socket 22. Specifically, the reflector 27 is mounted on the first surface 252 of the cover 25. Optionally, the reflector 27 is assembled to the cover 25 by a connecting part 271. The connecting part 271 can be a glue or a bracket or the like. Alternatively, the reflector 27 may be formed directly on the first surface 252 of the cover 25 by insert molding, and is not limited thereto.

As shown in FIG. 3 and FIG. 4, the receiving antenna circuit board 26 is formed on the carrier board 21. Specifically, the receiving antenna circuit board 26 is integrated in the interposer 212 of the carrier board 21, and the receiving antenna circuit board 26 can be formed together with associated circuits on the carrier board 21 during a manufacture of the carrier board 21.

As shown in FIG. 3 and FIG. 4, each pogo pin 122 of test socket 12 includes a compressed state and an initial state. Specifically, as shown in FIG. 3, if the frame 24 is separated from the cover 25, the pogo pins 222 are in the initial state, and the pogo pins 222 are electrically separated from the carrier board 21. As shown in FIG. 4, if the frame 24 is assembled with the cover 25, the protrusion member 251 of the cover 25 is in contact with a periphery of the AiP IC 20, and the protrusion member 251 applies a downward pressure to the periphery of the AiP IC 20, so that the pogo pins 222 are converted from the initial state to the compressed state, and then one end of each pogo pin 222 is in electrical contact with a corresponding component (e.g., a contact pad) of the interposer 212 of the carrier board 21.

In the present disclosure, after the wireless signal emitted by the AiP IC 20 is transmitted upward to reach the reflector 27, the reflector 27 reflects the wireless signal and directs it to the receiving antenna circuit board 26. Then, the receiving antenna circuit board 26 can transmit the wireless signal from the AiP IC 20 to an external instrument for corresponding signal processing and analyzing. For example, the carrier board 21 is connected to the external instrument 28 via a connector 281 and a coaxial-cable 282. Thus, the wireless signal (such as a high-speed RF signal) received by the receiving antenna circuit board 26 can be sequentially transmitted through the carrier board 21, the connector 281, and the coaxial-cable 282 to the external instrument 28. In the present disclosure, the external instrument 28 may include, but is not limited to, an automatic test equipment (ATE). It should be understood that, as shown in FIG. 4, since the receiving antenna circuit board 26 is integrated in the carrier board 21, a receiving surface 261 of the receiving antenna circuit board 26 is substantially parallel to an emitting surface 201 of the AiP IC 20 which emits the wireless signal.

Alternatively, when the carrier board 21 is in electrical contact with the test socket 22, the test socket 22 can receive a test signal from the carrier board 21 and pass it to the AiP IC 20 to drive the AiP IC 20 to generate a feedback signal. Moreover, the feedback signal can be transmitted back to the carrier board 21 via the test socket 22, and then the feedback signal can be output to an analytical instrument via the carrier board 21.

In summary, in the second embodiment of the present disclosure, by setting the carrier board 21 integrated with the receiving antenna circuit board 26 and the reflector 27 in the AiP IC testing apparatus 2, the AiP IC testing apparatus 2 can be used not only to test the feedback signal transmitted by the test pin of the AiP IC 20, but also to test the wireless signal from the AiP IC 20. Furthermore, the receiving antenna circuit board 26 is integrated in the carrier board 21, so that the AiP IC 2 has a simple configuration, is less difficult to manufacture, thereby improving a shock resistance, and achieving advantages of stability and firmness.

The above descriptions are merely preferable embodiments of the present disclosure. Any modification or replacement made by those skilled in the art without departing from the spirit and principle of the present disclosure should fall within the protection scope of the present disclosure.

What is claimed is:

1. An integrated circuit with antenna in package (AiP IC) testing apparatus, comprising:
   a carrier board;
   a test socket disposed on the carrier board and configured to carry an AiP IC, wherein the AiP IC emits a wireless signal;
   a receiving antenna circuit board adjacent to the test socket and configured to receive the wireless signal;
   a reflector disposed above the test socket and configured to reflect the wireless signal emitted by the AiP IC and direct the wireless signal to the receiving antenna circuit board;
   a frame disposed on the carrier board and surrounding the test socket; and
   a cover detachably disposed on the frame, wherein the reflector is mounted on a surface of the cover facing the test socket.

2. The AiP IC testing apparatus as claimed in claim 1, wherein the test socket comprises a plurality of pogo pins, and the cover comprises a protrusion member, and each of the pogo pins comprises a compressed state and an initial state;
   in response to the frame being separated from the cover, the plurality of pogo pins are in the initial state and are electrically separated from the carrier board; and
   in response to the cover being assembled with the frame, the protrusion member of the cover contacts a periphery of the AiP IC, and the protrusion member applies a pressure to the periphery of the AiP IC, such that the plurality of pogo pins are converted from the initial state to the compressed state and electrically contacted with the carrier board.

3. The AiP IC testing apparatus as claimed in claim 1, further comprising a soft board disposed on the test socket, wherein the receiving antenna circuit board is disposed at an angle on the soft board.

4. The AiP IC testing apparatus as claimed in claim 3, further comprising an angle adjuster disposed between the receiving antenna circuit board and the soft board, such that the receiving antenna circuit board is rotatably connected to the soft board, and the angle between the receiving antenna circuit board and the soft board is adjusted by the angle adjuster.

5. The AiP IC testing apparatus as claimed in claim 1, wherein the receiving antenna circuit board is formed on the carrier board and integrated in an interposer of the carrier boards.

6. The AiP IC testing apparatus as claimed in claim 5, wherein a receiving surface of the receiving antenna circuit board is parallel to an emitting surface of the AiP IC that emits the wireless signal.

7. The AiP IC testing apparatus as claimed in claim 1, further comprising a connector and a coaxial-cable which are connected between the receiving antenna circuit board and an external instrument, wherein in response to the receiving antenna circuit board receiving the wireless signal, the receiving antenna circuit board transmits the wireless signal to the external instrument via the connector and the coaxial-cable.

\* \* \* \* \*